(12) United States Patent
Ma et al.

(10) Patent No.: US 10,720,530 B2
(45) Date of Patent: Jul. 21, 2020

(54) SEMICONDUCTOR DEVICE AND METHODS OF FORMING SAME

(71) Applicant: Taiwan Semiconductor Manufacturing Company, Ltd., Hsinchu (TW)

(72) Inventors: Chih-Yu Ma, Hsinchu (TW); Shahaji B. More, Hsinchu (TW); Yi-Min Huang, Tainan (TW); Shih-Chieh Chang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/196,832

(22) Filed: Nov. 20, 2018

(65) Prior Publication Data

US 2020/0105934 A1 Apr. 2, 2020

Related U.S. Application Data

(60) Provisional application No. 62/737,770, filed on Sep. 27, 2018.

(51) Int. Cl.
| | |
|---|---|
| *H01L 29/78* | (2006.01) |
| *H01L 27/092* | (2006.01) |
| *H01L 21/82* | (2006.01) |
| *H01L 29/08* | (2006.01) |
| *H01L 29/66* | (2006.01) |
| *H01L 21/8238* | (2006.01) |

(52) U.S. Cl.
CPC .. *H01L 29/7851* (2013.01); *H01L 21/823821* (2013.01); *H01L 21/823864* (2013.01); *H01L 27/0924* (2013.01); *H01L 29/0847* (2013.01); *H01L 29/6681* (2013.01); *H01L 29/66545* (2013.01)

(58) Field of Classification Search
CPC ... H01L 29/08; H01L 29/084; H01L 29/0847; H01L 29/66; H01L 29/665; H01L 29/6654; H01L 29/66545; H01L 29/668; H01L 29/6681; H01L 29/78; H01L 29/785; H01L 29/7851; H01L 27/09; H01L 27/092; H01L 27/0924; H01L 21/82; H01L 21/823; H01L 21/8238; H01L 21/82382; H01L 21/823821
USPC ........................................................ 257/288
See application file for complete search history.

(56) References Cited

U.S. PATENT DOCUMENTS 9,923,081 B1 * 3/2018 Bao .................. H01L 21/02532

* cited by examiner

*Primary Examiner* — Monica D Harrison
(74) *Attorney, Agent, or Firm* — Slater Matsil, LLP

(57) ABSTRACT

A device includes a fin extending from a substrate, a gate stack over and along sidewalls of the fin, a gate spacer along a sidewall of the gate stack, and an epitaxial source/drain region in the fin and adjacent the gate spacer. The epitaxial source/drain region includes a first epitaxial layer on the fin, the first epitaxial layer including silicon, germanium, and arsenic, and a second epitaxial layer on the first epitaxial layer, the second epitaxial layer including silicon and phosphorus, the first epitaxial layer separating the second epitaxial layer from the fin. The epitaxial source/drain region further includes a third epitaxial layer on the second epitaxial layer, the third epitaxial layer including silicon, germanium, and phosphorus.

20 Claims, 18 Drawing Sheets

SEMICONDUCTOR DEVICE AND METHODS OF FORMING SAME

PRIORITY

This application claims priority to U.S. Provisional Patent Application No. 62/737,770 filed Sep. 27, 2018, and entitled "Semiconductor Device and Methods of Forming Same," which application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
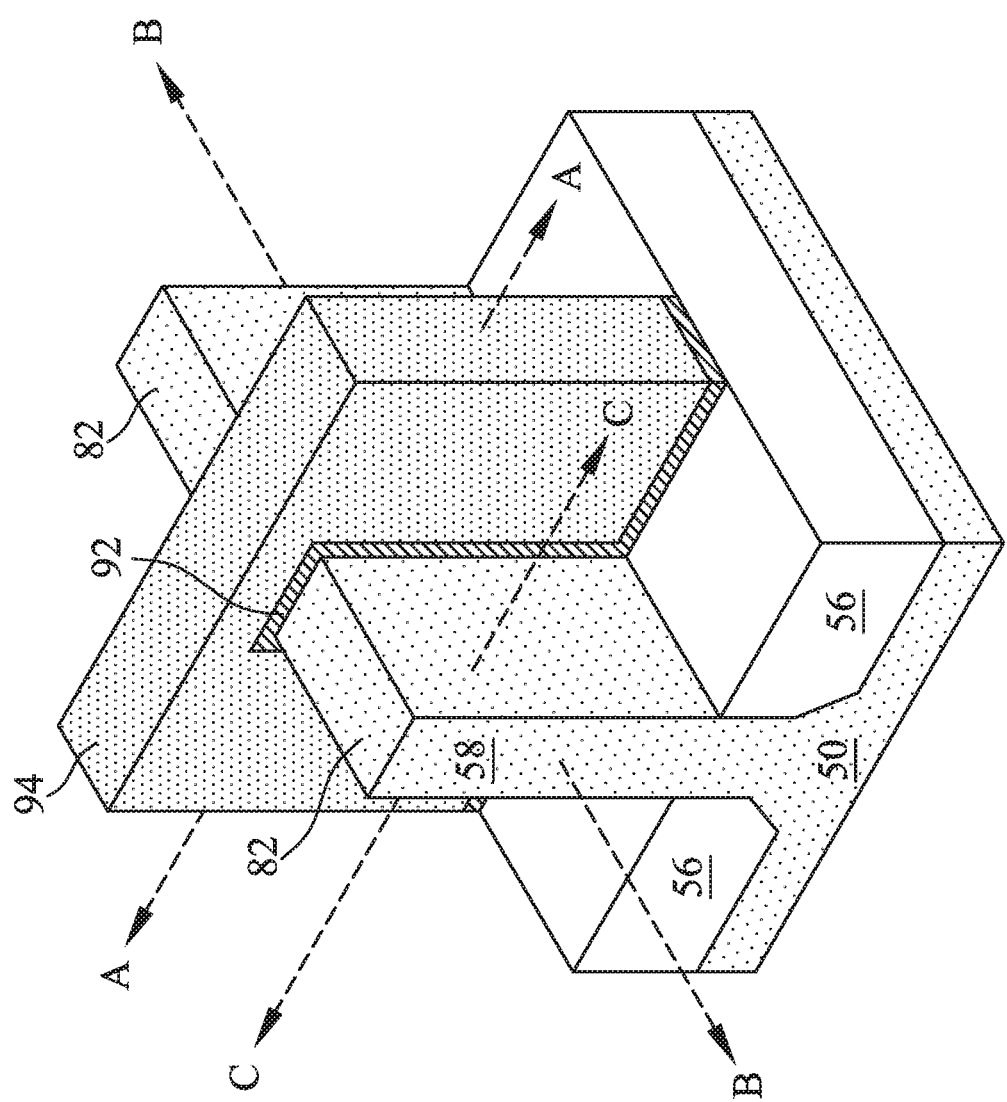
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are discussed herein in a particular context, namely, forming epitaxial source/drain regions in an n-type FinFET transistor. However, various embodiments may be applied to other semiconductor devices/processes, such as planar transistors. In some embodiments, the epitaxial source/drain regions described herein includes a bottom layer of silicon-germanium (SiGe) doped with arsenic (As). In some cases, the presence of Ge allows for an increased concentration of activated As dopants. Additionally, the presence of As in the bottom layer can block other dopants from diffusing into other regions of the FinFET.

FIG. 1 illustrates an example of a FinFET in a three-dimensional view, in accordance with some embodiments. The FinFET comprises a fin 58 on a substrate 50 (e.g., a semiconductor substrate). Isolation regions 56 are disposed in the substrate 50, and the fin 58 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. A gate dielectric layer 92 is along sidewalls and over a top surface of the fin 58, and a gate electrode 94 is over the gate dielectric layer 92. Source/drain regions 82 are disposed in opposite sides of the fin 58 with respect to the gate dielectric layer 92 and gate electrode 94. FIG. 1 further illustrates reference cross-sections that are used in later figures. Cross-section A-A is along a longitudinal axis of the gate electrode 94 and in a direction, for example perpendicular to the direction of current flow between the source/drain regions 82 of the FinFET. Cross-section B-B is perpendicular to cross-section A-A and is along a longitudinal axis of the fin 58 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

Figure 14A:
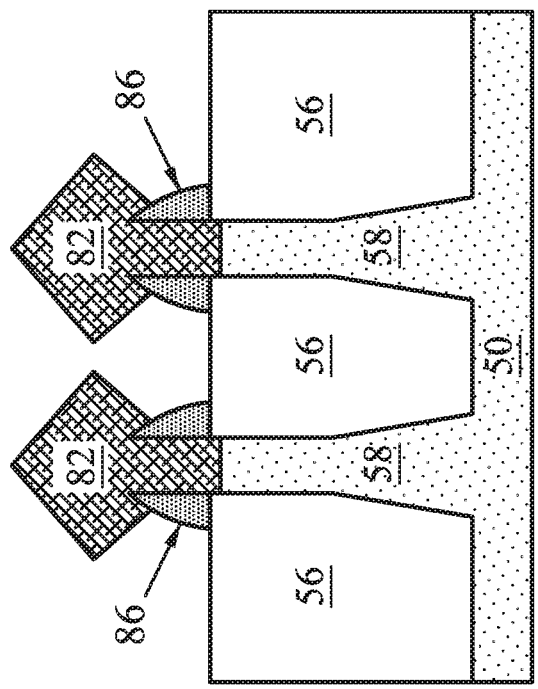
FIGS. 14A, 14B, 15A, 15B, 16A, 16B, 17A, 17B, 18A, 18B, 19A, 19B, 20A, and 20B are cross-sectional views of intermediate stages in the manufacturing of FinFETs, in accordance with some embodiments.
Figure 14B:
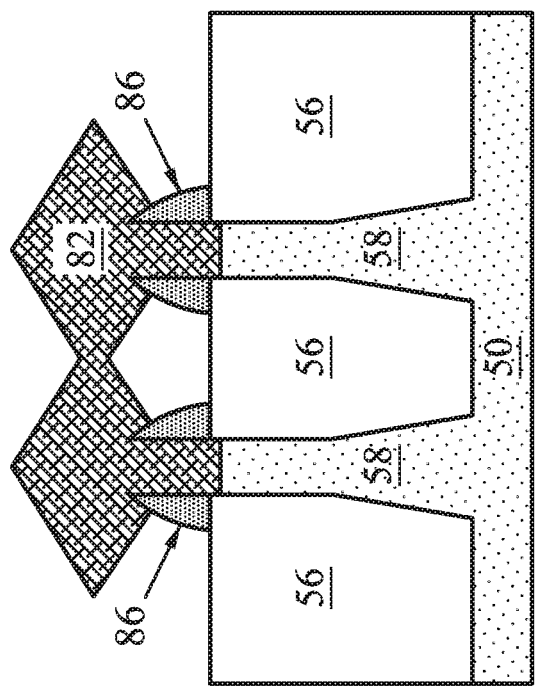

FIGS. 2 through 12 and 14A-20B are cross-sectional views of intermediate stages in the manufacturing of Fin- FETs, in accordance with some embodiments. FIGS. 2 through 12 illustrate reference cross-section A-A illustrated in FIG. 1, except for multiple fins/FinFETs. In FIGS. 8A through 9B and FIGS. 15A through 20B, figures ending with an "A" designation are illustrated along reference cross-section A-A illustrated in FIG. 1, and figures ending with a "B" designation are illustrated along a similar cross-section B-B illustrated in FIG. 1, except for multiple fins/FinFETs. FIGS. 14A and 14B are illustrated along reference cross-section C-C illustrated in FIG. 1, except for multiple fins/FinFETs.

Figure 2:
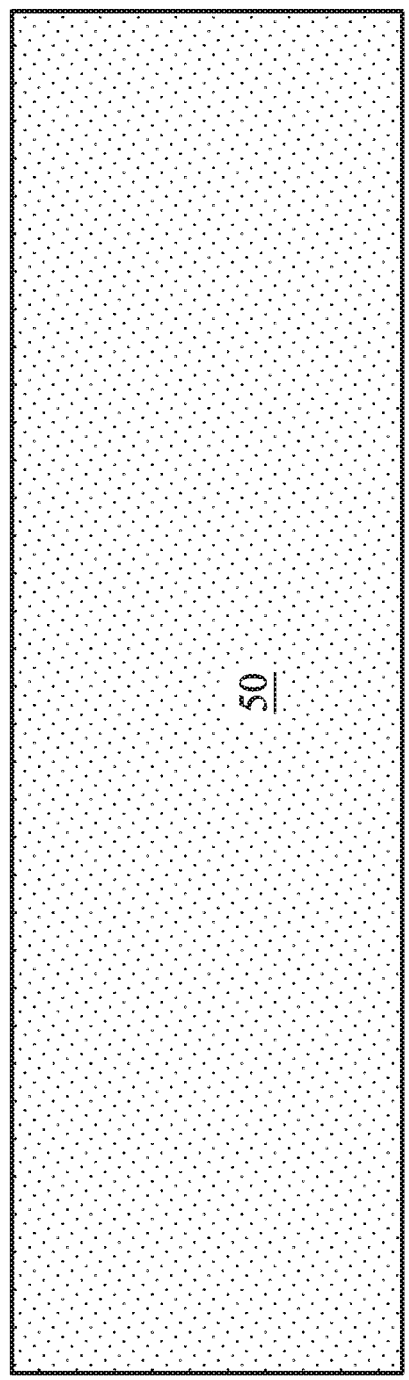
FIGS. 2, 3, 4, 5, 6, 7, 8A, 8B, 9A, and 9B, are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Different regions of the substrate 50 can be used be for forming n-type devices, such as NMOS transistors (e.g., n-type FinFETs) or for forming p-type devices, such as PMOS transistors (e.g., p-type FinFETs). Regions of the substrate 50 in which n-type devices or p-type devices are formed are respectively referred to herein as "NMOS regions" or "PMOS regions." FIGS. 2-20B illustrate an NMOS region of the substrate 50, though, as described below, FIGS. 2-10 may also be applicable to PMOS regions of the substrate 50. Different regions (e.g., NMOS regions and/or PMOS regions) of the substrate 50 may be physically separated, and any number of device features (e.g., other active devices, doped regions, isolation structures, etc.) may be disposed between different regions.

Figure 3:
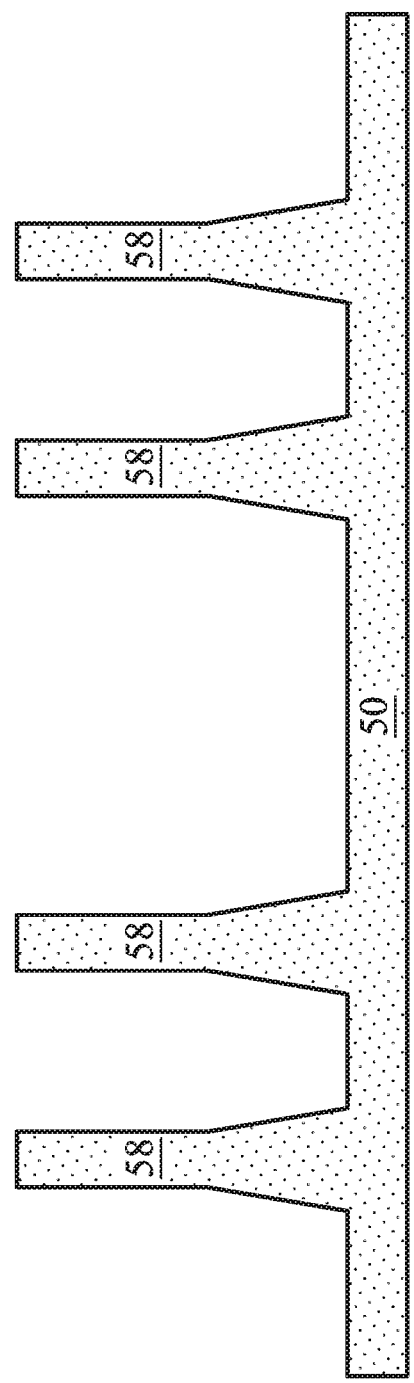

In FIG. 3, fins 58 are formed in the substrate 50. The fins 58 may be, for example, semiconductor strips. In some embodiments, the fins 58 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 4:
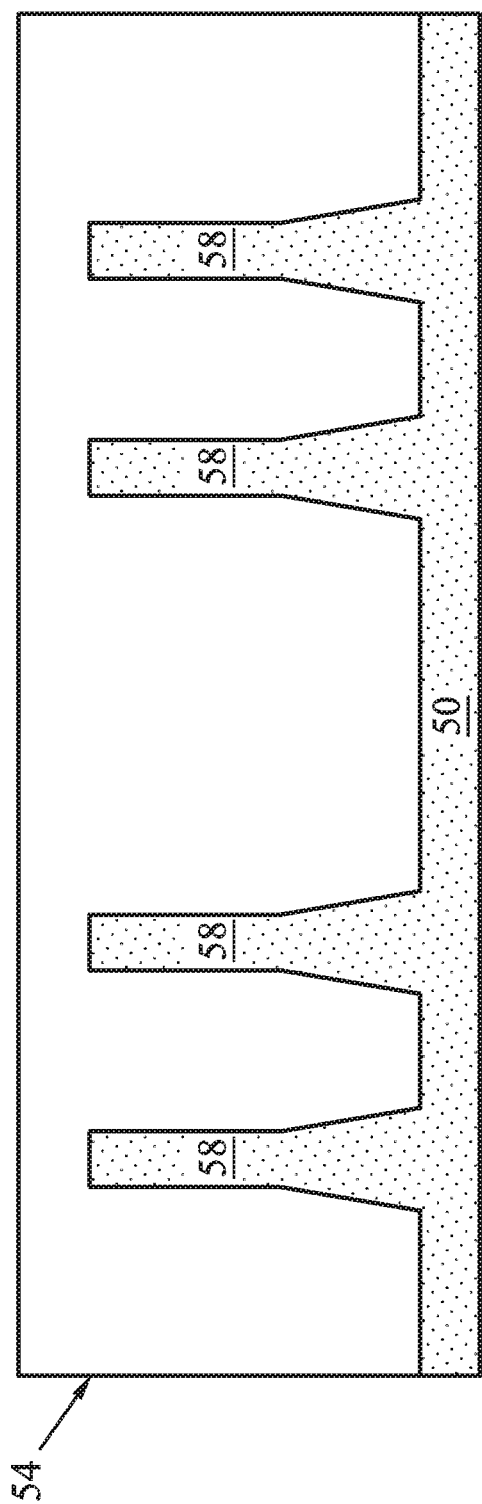

In FIG. 4, an insulation material 54 is formed over the substrate 50 and between neighboring fins 58. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 58.

Figure 5:
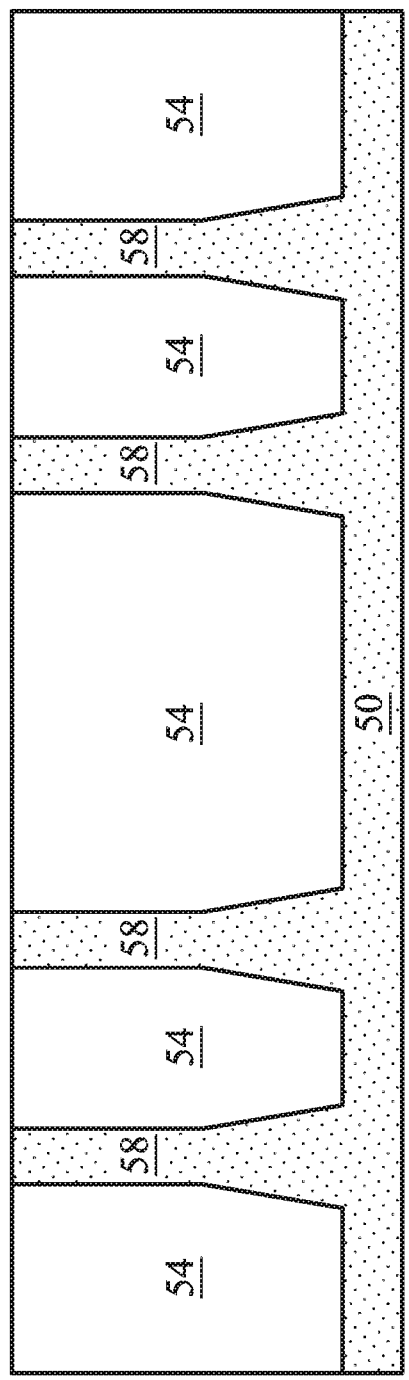

In FIG. 5, a planarization process is applied to the insulation material 54. In some embodiments, the planarization process includes a chemical mechanical polish (CMP), an etch-back process, combinations thereof, or the like. The planarization process exposes the fins 58. Top surfaces of the fins 58 and the insulation material 54 are level after the planarization process is complete.

Figure 6:
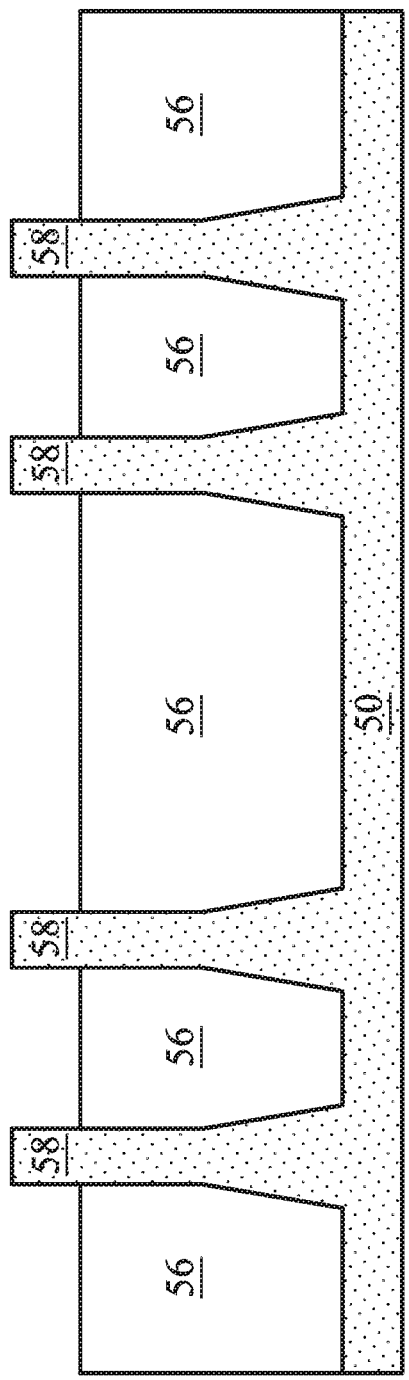

In FIG. 6, the insulation material 54 is recessed to form Shallow Trench Isolation (STI) regions 56. The insulation material 54 is recessed such that fins 58 protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54.

The process described with respect to FIGS. 2 through 6 is just one example of how the fins 58 may be formed. In some embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In some embodiments, heteroepitaxial structures can be used for the fins 58. For example, the fins 58 in FIG. 5 can be recessed, and a material different from the fins 58 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form the fins 58. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 58 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 58 and/or the substrate 50. In some embodiments, P-wells may be formed in NMOS regions and N-wells may be formed in one or more different PMOS regions. In the embodiments with different well types, the different implant steps for different regions may be achieved using a photoresist or other masks (not shown). For example, a photoresist may be formed over the fins 58 and the STI regions 56. The photoresist is then patterned to expose another region of the substrate 50, such as one or more PMOS regions. The photoresist can be formed by using a spin-on technique and can be patterned using acceptable photolithography techniques. Once the photoresist is patterned, an n-type impurity implant is performed in the PMOS regions, and the photoresist may act as a mask to substantially prevent n-type impurities from being implanted into other regions, such as the NMOS region shown in FIG. 6 or other NMOS regions. The n-type impurities may be phosphorus, arsenic, or the like implanted in the region to a concentration of equal to or less than $10^{18}$ $cm^{-3}$, such as between about $1017 cm^{-3}$ and about $10^{18} cm^-$. After the implant, the photoresist is removed, such as by an acceptable ashing process.

Following the implanting of the PMOS region, a photoresist is formed over the fins 58 and the STI regions 56. The photoresist is patterned to expose NMOS regions of the substrate 50, such as the NMOS region shown in FIG. 6 or another NMOS region. The photoresist can be formed by using a spin-on technique and can be patterned using acceptable photolithography techniques. Once the photoresist is patterned, a p-type impurity implant may be performed in the NMOS regions, and the photoresist may act as a mask to substantially prevent p-type impurities from being implanted into the PMOS regions. The p-type impurities may be boron, $BF_2$, or the like implanted in the region to a concentration of equal to or less than $10^{18} cm^{-3}$, such as between about $10^{17} cm^{-3}$ and about $10^{18} cm^{-3}$. After the implant, the photoresist may be removed, such as by an acceptable ashing process.

After the implants, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
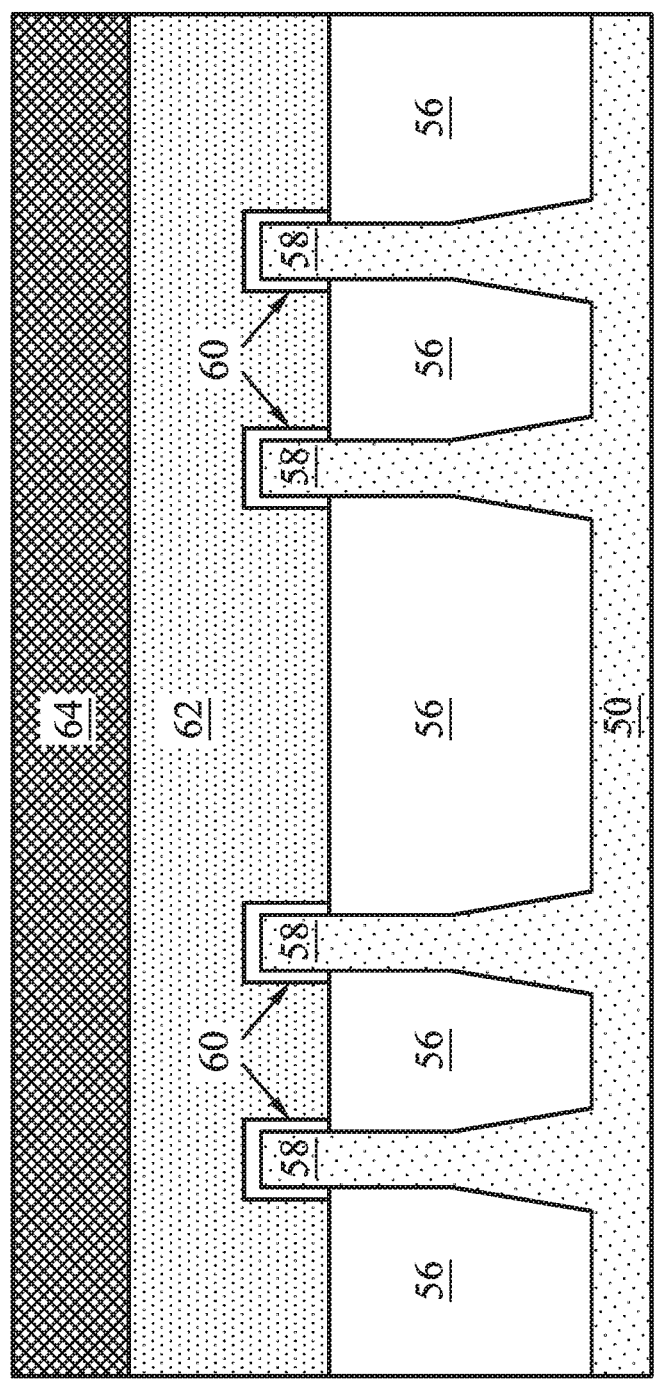

In FIG. 7, a dummy dielectric layer 60 is formed on the fins 58. The dummy dielectric layer 60 may be, for example, an oxide (e.g., silicon oxide), a nitride (e.g., silicon nitride), a combination thereof, or the like, and may be deposited or thermally grown according to acceptable techniques. A dummy gate layer 62 is formed over the dummy dielectric layer 60 and the STI regions 56, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, an oxide (e.g., silicon oxide), a nitride (e.g., silicon nitride), SiON, other materials, the like, or multilayers thereof. In this example, a single dummy gate layer 62 and a single mask layer 64 are formed across both NMOS regions and PMOS regions. In some embodiments, separate dummy gate layers may be formed in NMOS regions and PMOS regions, and separate mask layers may be formed in NMOS regions and PMOS regions.

Figure 8B:
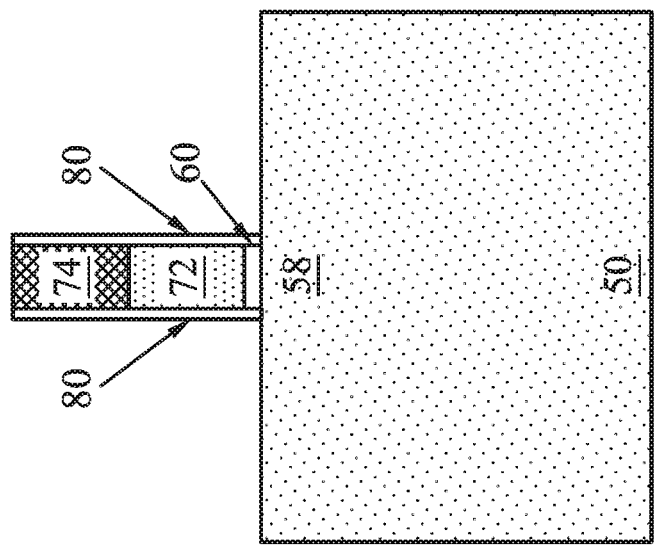
Figure 8A:
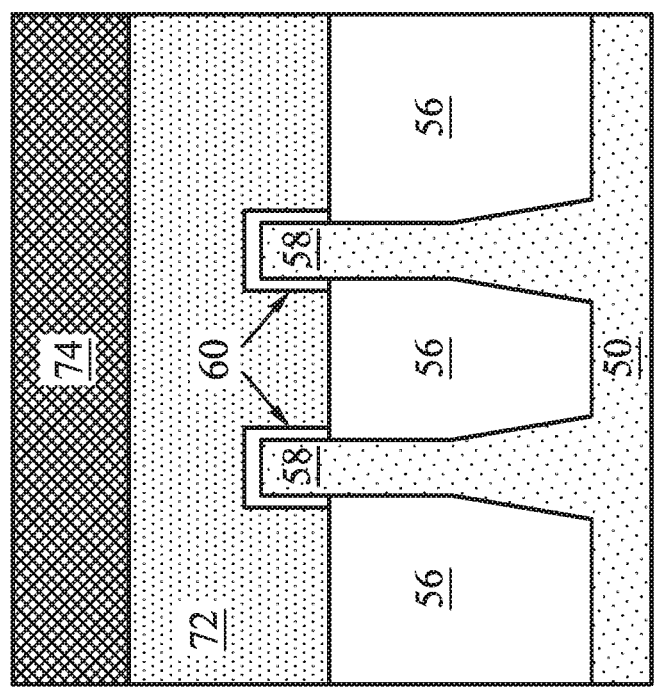

FIGS. 8A through 16B illustrate various additional steps in the manufacturing of embodiment devices. In FIGS. 8A and 8B, the mask layer 64 may be patterned using acceptable photolithography and etching techniques to form masks 74. The pattern of the masks 74 then may be transferred to the dummy gate layer 62 and the dummy dielectric layer 60 by an acceptable etching technique to form dummy gates 72. The dummy gates 72 cover respective channel regions of the fins 58. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 58.

Further in FIGS. 8A and 8B, gate seal spacers 80 can be formed on exposed surfaces of the dummy gates 72, the masks 74, and/or the fins 58. A thermal oxidation or a deposition followed by an anisotropic etch may form the gate seal spacers 80.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over a first region, while exposing a second region, and appropriate type (e.g., n-type or p-type) impurities may be implanted into the exposed fins 58 in the second region. The mask may then be removed. Subsequently, a mask, such as a photoresist, may be formed over the second region while exposing the first region, and appropriate type impurities may be implanted into the exposed fins 58 in the first region. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15} cm^{-3}$ to about $10^{16} cm^{-3}$. An anneal may be used to activate the implanted impurities.

Figure 9B:
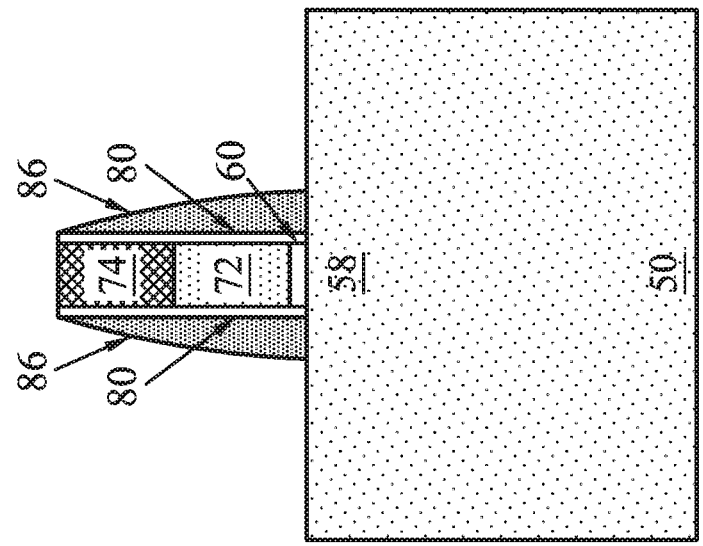
Figure 9A:
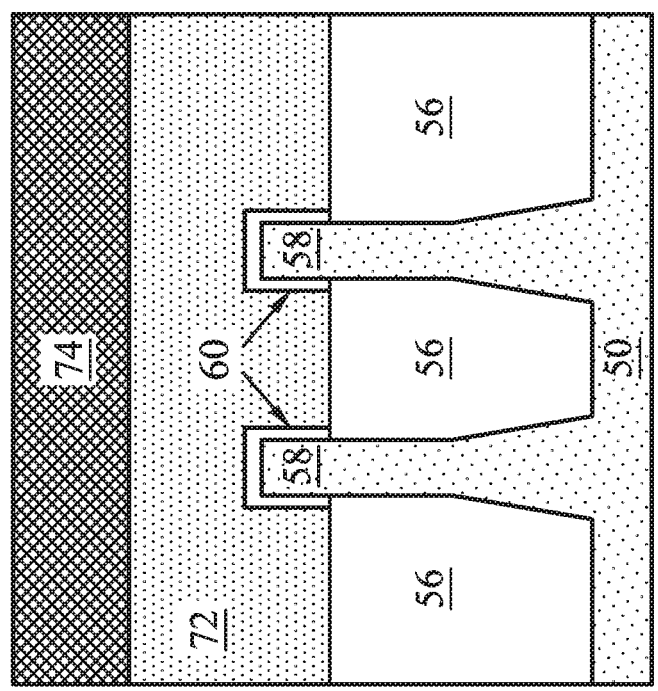

In FIGS. 9A and 9B, gate spacers 86 are formed on the gate seal spacers 80 along sidewalls of the dummy gates 72 and the masks 74. The gate spacers 86 may be formed by conformally depositing a material and subsequently anisotropically etching the material. The material of the gate spacers 86 may be silicon nitride, SiCN, a combination thereof, or the like.

Figure 10:
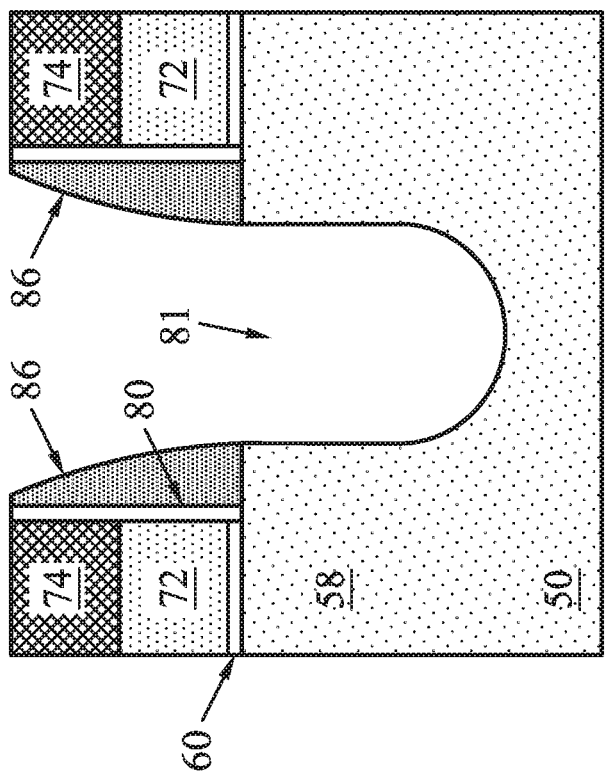
FIG. 10 is a cross-sectional view of forming a recess in the source/drain region of a fin in an intermediate stage in the manufacturing of FinFETs, in accordance with some embodiments.
Figure 11:
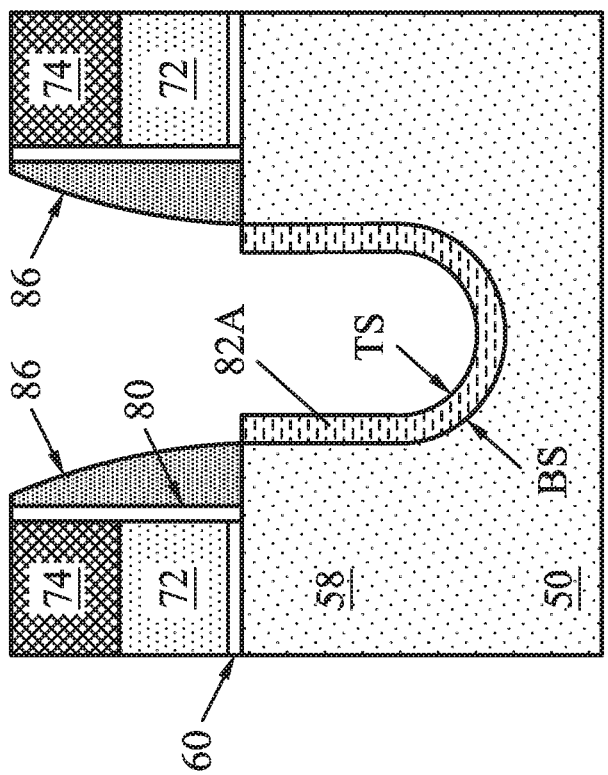
FIGS. 11 and 12 are cross-sectional views of forming epitaxial source/drain regions in intermediate stages in the manufacturing of FinFETs, in accordance with some embodiments.
Figure 12:
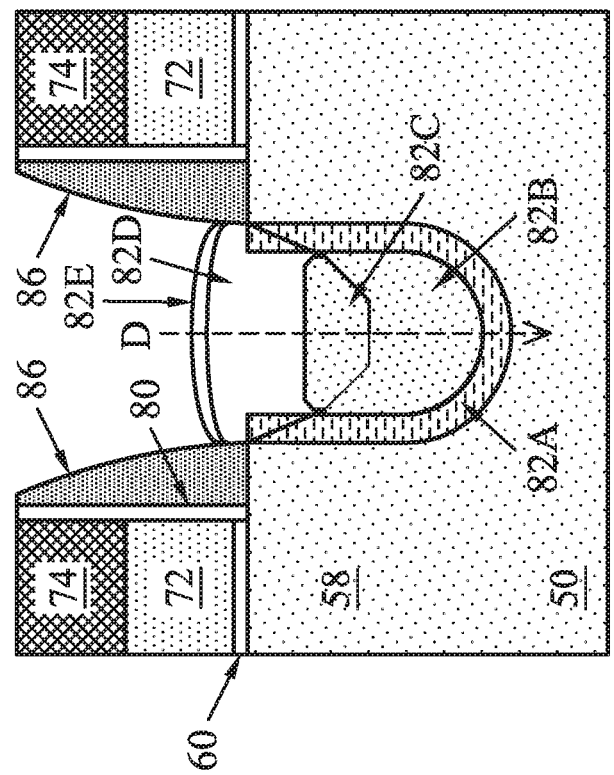

In FIGS. 10-12, epitaxial source/drain regions 82 are formed in the fins 58 according to some embodiments. FIGS. 10-12 are illustrated along reference cross-section B-B, and show the formation of an epitaxial source/drain region 82 in a fin 58 between neighboring dummy gates 72. The epitaxial source/drain regions 82 are formed in the fins 58 such that each dummy gate 72 is disposed between respective neighboring pairs of the epitaxial source/drain regions 82. In some embodiments, the epitaxial source/drain regions 82 may extend through the LDD regions. In some embodiments, the gate seal spacers 80 and gate spacers 86 are used to separate the epitaxial source/drain regions 82 from the dummy gates 72.

During the formation of the epitaxial source/drain regions 82, PMOS regions may be masked by a mask (not shown). Referring first to FIG. 10, a patterning process is performed on the fins 58 to form recesses 81 in source/drain regions of the fins 58. The patterning process may be performed in a manner that the recesses 81 are formed between neighboring dummy gate stacks 72 (in interior regions of the fins 58), or between an isolation region 56 and adjacent dummy gate stacks 72 (in end regions of the fins 58). In some embodiments, the patterning process may include a suitable anisotropic dry etching process, while using the dummy gate stacks 72, the gate spacers 86, and/or isolation regions 56 as a combined mask. In some embodiments, the recesses 81 may be formed having a vertical depth between about 40 nm and about 80 nm from the top surface of the fins 58. The suitable anisotropic dry etching process may include a reactive ion etch (RIE), neutral beam etch (NBE), the like, or a combination thereof. In some embodiments where the RIE is used in the first patterning process, process parameters such as, for example, a process gas mixture, a voltage bias, and an RF power may be chosen such that etching is predominantly performed using physical etching, such as ion bombardment, rather than chemical etching, such as radical etching through chemical reactions. In some embodiments, a voltage bias may be increased to increase energy of ions used in the ion bombardment process and, thus, increase a rate of physical etching. Since, the physical etching in anisotropic in nature and the chemical etching is isotropic in nature, such an etching process has an etch rate in the vertical direction that is greater than an etch rate in the lateral direction. In some embodiments, the anisotropic etching process may be performed using a process gas mixture including $CH_3F$, $CH_4$, HBr, $O_2$, Ar, the like, or a combination thereof. In some embodiments, the patterning process forms recesses 81 having U-shaped bottom surfaces. The recesses 81 may also be referred to as U-shaped recesses 81, an example recess 81 of which is shown in FIG. 10.

FIGS. 11-12 illustrate the formation of an epitaxial source/drain region 82 within a recess 81, according to some embodiments. The epitaxial source/drain regions 82 may include any acceptable material, such as appropriate for n-type FinFETs. In some embodiments, the epitaxial source/drain regions 82 are formed from multiple epitaxial layers. In some embodiments, the different epitaxial layers of an epitaxial source/drain region 82 may have different compositions of semiconductor materials, different dopants or combinations of dopants, or have different concentrations of one or more dopants. The transitions between different epitaxial layers of the epitaxial source/drain regions 82 may be abrupt or gradual. In the embodiment shown in FIG. 12, the epitaxial source/drain region 82 is shown including multiple epitaxial layers 82A-E, which may be collectively referred to herein as the epitaxial source/drain region 82. The epitaxial source/drain regions 82 may have surfaces raised from respective surfaces of the fins 58 and may have facets. In some embodiments, an anneal process may be performed after the epitaxial source/drain regions 82 are formed. In some embodiments, an anneal process may be performed during formation of the epitaxial source/drain regions 82, for example, after the growth of an epitaxial layer of an epitaxial source/drain region 82.

Turning to FIG. 11, a first epitaxial layer 82A is grown in the recess 81. In some embodiments, the first epitaxial layer 82A is silicon (Si), and may include other semiconductor materials such as germanium (Ge), dopants such as gallium (Ga), carbon (C), arsenic (As), or phosphorous (P), or other materials. For example, the first epitaxial layer 82A may include a composition of $Si_{1-x}Ge_x$, where x indicates the atomic fraction of Ge, and which may or may not be uniform throughout the first epitaxial layer 82A. The atomic fraction x may be between about 0.001 and about 0.05, such as about 0.005, in some embodiments. In some cases, incorporating Ge within the first epitaxial layer 82A may increase the solid solubility of dopants (e.g., P, As, etc.) within the first epitaxial layer 82A, thus allowing for a higher concentration of activated dopants (described in greater detail below). In some embodiments, the concentration profiles of As, P, or other dopants are not uniform throughout the first epitaxial layer 82A. For example, portions of the first epitaxial layer 82A that are farther from the sidewalls of the recess 81 (i.e., near the top surface "TS") may have a higher concentration of P than portions of the first epitaxial layer 82A that are closer to the sidewalls of the recess 81 (i.e, near the bottom surface "BS"). As another example, the concentration profile of As may be greatest within the first epitaxial layer 82A and away from both the top surface ("TS") and the bottom surface ("BS"). These are examples, and other dopant concentration profiles are possible in other embodiments.

The first epitaxial layer 82A may be grown as a layer covering the surfaces of the recess 81 (e.g., conformally) and may have a thickness on the surfaces of the recess 81 between about 0.5 nm and about 15 nm. In some embodiments, the first epitaxial layer 82A may be grown as multiple epitaxial sublayers. For example, the first epitaxial layer 82A may be grown sequentially as a first sublayer, a second sublayer, and a third sublayer. The first sublayer may be SiGe doped with As that is between about 0.5 nm and about 10 nm thick. The first sublayer may be grown having an atomic concentration of Ge between about 0.1% and about 5%, and having a concentration of As between about 1 E20 $cm^{-3}$ and about 1 E21 $cm^{-3}$. In some cases, the first sublayer is grown without explicitly incorporating P, though P may subsequently diffuse into the first sublayer, described below. The second sublayer may be SiGe doped with As and P that is between about 1 nm and about 10 nm thick. The second sublayer may be grown having an atomic concentration of Ge between about 0.1% and about 5%, having a concentration of As between about 1 E20 $cm^{-3}$ and about 1 E21 $cm^{-3}$, and having a concentration of P between about 1 E20 $cm^{-3}$ and about 1 E21 $cm^{-3}$. The third sublayer may be Si doped with P that is between about 1 nm and about 10 nm thick. The third sublayer may be grown having a concentration of P between about 1 E20 $cm^{-3}$ and about 2 E21 $cm^{-3}$. These are examples, and the first epitaxial layer 82A may have more sublayers, fewer sublayers, or sublayers having different compositions, thicknesses, or properties in other embodiments. In some cases, dopants of other sublayers or epitaxial layers may diffuse such that a sublayer may contain a nonzero concentration of one or more dopants that were not explicitly incorporated during the growth of that sublayer.

In some embodiments, the first epitaxial layer 82A is formed with the dopants (e.g., Ge, As, P, etc.) introduced in-situ during growth. In some embodiments, the dopant concentration profiles of the dopants may be controlled by controlling the amounts of dopant introduced during growth of the first epitaxial layer 82A. For example, the first epitaxial layer 82A may be formed as SiGe having the greatest concentration of Ge approximately coinciding with the greatest concentration of As. In some embodiments, the first epitaxial layer 82A is grown as undoped Si within the recess 81, and then species such as Ge, Ga, As and/or P are implanted into the first epitaxial layer 82A. In some embodiments, no Si is grown, and the species are implanted into the exposed surfaces of the recess 81. An anneal process may be performed after implantation to activate the implanted species.

Incorporating Ge into the material of the first epitaxial layer 82A may achieve advantages. For example, the presence of Ge in Si can increase the amount of dopants such as As or P that are activated during an anneal process. Atoms of Ge are larger than atoms of Si, and thus vacancies in SiGe may be larger than vacancies in Si. The availability of larger vacancies can allow for dopants such as As or P to more easily migrate into a vacancy site and become an active dopant during an anneal process. Thus, the presence of Ge can improve the solid solubility of dopants such as As or P. In this manner, the active dopant concentration of an epitaxial layer (such as the first epitaxial layer 82A) can be increased. In some embodiments, Ga may be used instead of or in addition to Ge to improve the solid solubility of dopants.

Additionally, the presence of As within the first epitaxial layer 82A can block some P atoms from diffusing into the first epitaxial layer 82A. By doping the first epitaxial layer with As, the amount of P atoms that are able to diffuse through the first epitaxial layer 82A can be reduced. The diffusing P atoms may be, for example, from P-doped epitaxial layers formed over the first epitaxial layer 82A, such as one or more of epitaxial layers 82B-E, described below. In some cases, P atoms that have diffused into the fins 58 can degrade device performance, such as by worsening the short channel effect. In this manner, the use of As in the first epitaxial layer 82A can improve device performance by reducing diffusion of dopants (e.g., P atoms) into the fins 58. As described, the use of Ge with As can increase the concentration of As, and thus the presence of Ge with As can enhance the diffusion-blocking properties of the first epitaxial layer 82A.

Turning to FIG. 12, additional epitaxial layers 82B-E of the epitaxial source/drain region 82 are formed according to an embodiment. The epitaxial layers 82B-E may be formed using a single epitaxial process or using separate epitaxial processes. The epitaxial layers 82B-E shown are illustrative examples, and in other embodiments the epitaxial source/drain region 82 may have more epitaxial layers, fewer epitaxial layers, or epitaxial layers with different compositions, thicknesses, or other properties than described in FIG. 12. The epitaxial layers 82B-E may have different shapes than those shown in FIG. 12. These and other variations are within the scope of this disclosure.

In some embodiments, a second epitaxial layer 82B may be formed over the first epitaxial layer 82A. The second epitaxial layer 82B may, for example, be a layer of Si doped with P that has a vertical thickness between about 5 nm and about 30 nm. In some embodiments, the second epitaxial layer 82B may be grown having a concentration of P between about 1 E20 cm$^{-3}$ and about 3 E21 cm$^{-3}$. In some embodiments, the second epitaxial layer 82B may have a different thickness or include different dopants or concentrations of dopants.

In some embodiments, a third epitaxial layer 82C may be formed over the second epitaxial layer 82B. The third epitaxial layer 82C may, for example, be a layer of SiGe doped with P that has a vertical thickness between about 5 nm and about 30 nm. The third epitaxial layer 82C may be grown having an atomic concentration of Ge between about 0.1% and about 5%. In some embodiments, the third epitaxial layer 82C may be grown having a concentration of P between about 5 E20 cm$^{-3}$ and about 5 E21 cm$^{-3}$. In some cases, incorporating Ge within the third epitaxial layer 82C may increase the solid solubility of dopants (e.g., P, As, etc.) within the third epitaxial layer 82C, thus allowing for a higher concentration of activated dopants (described in greater detail below). In some cases, incorporating Ge within the third epitaxial layer 82C may allow for improved control of stress imparted on the fins 58 by the epitaxial source/drain region 82. In some embodiments, the third epitaxial layer 82C may have a different thickness or include different dopants or concentrations of dopants. In some embodiments, the third epitaxial layer 82C may have a different shape, such as having surfaces that taper to a point at the bottom of the third epitaxial layer 82C.

In some embodiments, a fourth epitaxial layer 82D may be formed over the third epitaxial layer 82C. The fourth epitaxial layer 82D may, for example, be a layer of Si doped with P that has a vertical thickness between about 5 nm and about 30 nm. In some embodiments, the fourth epitaxial layer 82D may be grown having a concentration of P between about 5 E20 cm$^{-3}$ and about 5 E21 cm$^{-3}$. In some embodiments, the fourth epitaxial layer 82D may have a different thickness or include different dopants or concentrations of dopants.

In some embodiments, a fifth epitaxial layer 82E may be formed over the fourth epitaxial layer 82D. The fifth epitaxial layer 82E may be, for example, a layer of SiGe doped with P that has a vertical thickness between about 1 nm and about 5 nm. The fifth epitaxial layer 82E may be grown having an atomic concentration of Ge between about 0.1% and about 5%. In some embodiments, the fifth epitaxial layer 82E may be grown having a concentration of P between about 5E 20 cm$^{-3}$ and about 2E 21 cm$^{-3}$. In some embodiments, fifth epitaxial layer 82E may include C as a dopant with or without P. In some embodiments, fifth epitaxial layer 82E may be grown as Si (without Ge). In some cases, incorporating Ge within the fifth epitaxial layer 82E may improve source/drain contacts 112 to the epitaxial source/drain region 82A, discussed below in FIGS. 20A-B. In some embodiments, the fifth epitaxial layer 82E may have a different thickness or include different dopants or concentrations of dopants.

Figure 13:
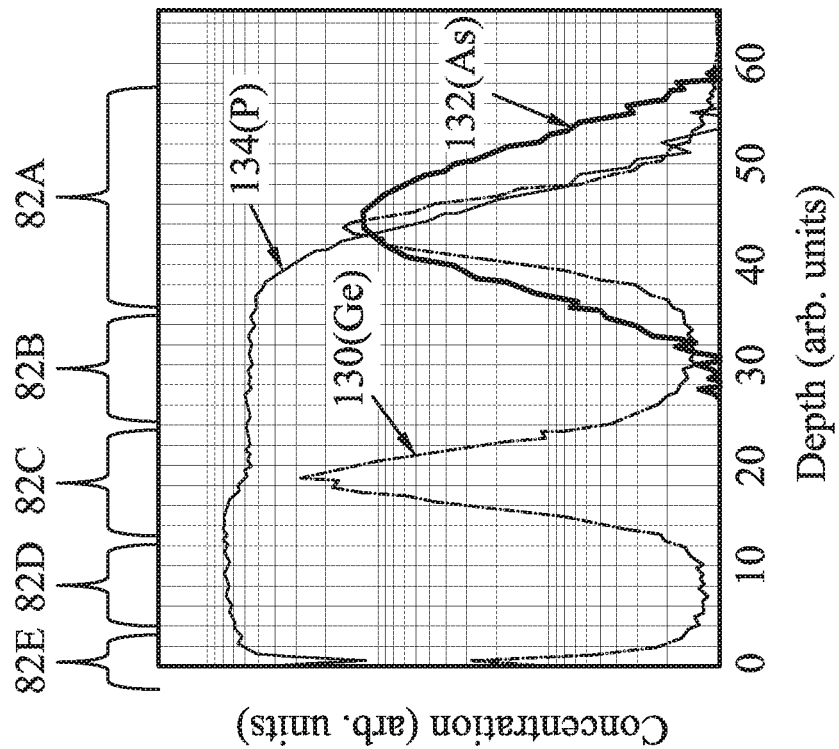
FIG. 13 is an illustration of a dopant profile of an epitaxial source/drain region of a FinFET, in accordance with some embodiments.

FIG. 13 is an illustration of example dopant concentration profiles of an epitaxial source/drain region, which may be similar to the epitaxial source/drain region 82 described previously. FIG. 13 shows the concentration of dopants (logarithmic scale, arbitrary units) in a silicon epitaxial source/drain region on the Y-axis and the depth (arbitrary units) into the epitaxial source/drain region on the X-axis. Curve 130 shows a concentration profile of Ge, curve 132 shows a concentration profile of As, and curve 134 shows a concentration profile of P. The depth into the epitaxial source/drain region is measured in a vertical direction from the top surface of the epitaxial source/drain region toward the bottom surface of the epitaxial source/drain region. For example, the depth may be measured as indicated by "D" in FIG. 12 for the epitaxial source/drain region 82. The epitaxial layers 82A-E are also indicated in FIG. 13, though the indications of the epitaxial layers 82A-E are approximate and intended to be illustrative. In other embodiments, epitaxial layers such as epitaxial layers 82A-E may be at different depths or have different relative sizes. In some embodiments, other dopants than those shown in FIG. 13 or different dopants than those shown in FIG. 13 may be present, and dopants may have different concentrations or different concentration profiles.

As shown in FIG. 13, the first epitaxial layer 82A includes Ge, As, and P dopants. The Ge and As dopants each have a maximum local concentration within the interior of the first epitaxial layer 82A. The concentration of P within the first epitaxial layer 82A decreases with increasing depth. The second epitaxial layer 82B includes P, with relatively little Ge or As. The second epitaxial layer 82B has a relatively uniform concentration of P, but in some cases the concentration of P may decrease with increasing depth. The third epitaxial layer 82C includes Ge and P. The concentration of Ge has a maximum local concentration within the interior of the third epitaxial layer 82C. In some cases, the maximum concentration of Ge within the third epitaxial layer 82C may be greater than the maximum concentration of Ge within the first epitaxial layer 82A. The concentration of P within the third epitaxial layer 82C may be greater than the concentration of P within the second epitaxial layer 82B. In some cases, the greatest concentration of P within the epitaxial source/drain region 82 may be within the third epitaxial region 82C. The fourth epitaxial layer 82D includes P, with relatively little Ge. The concentration of P within the fourth epitaxial layer 82D may be greater than the concentration of P within the second epitaxial layer 82B, and may be less than the concentration of P within the third epitaxial layer 82C. In some cases, the concentration of P within the fourth epitaxial layer 82E may increase with increasing depth. The fifth epitaxial layer 82E includes Ge and P. The concentration of P in the fifth epitaxial layer 82E may be less than that of one or more of the other epitaxial layers 82A-D. The concentration of Ge in the fifth epitaxial layer 82E may be less than that of the epitaxial layers 82A or 82C.

As a result of the epitaxy processes used to form the epitaxial source/drain regions 82, upper surfaces of the epitaxial source/drain regions 82 may have facets which expand laterally outward beyond sidewalls of the fins 58. In some embodiments, these facets cause adjacent source/drain regions 82 of a FinFET to merge as illustrated by FIG. 14A. In other embodiments, adjacent source/drain regions 82 remain separated after the epitaxy process is completed as illustrated by FIG. 14B.

After forming the epitaxial source/drain regions 82, epitaxial source/drain regions may be formed in a PMOS region of the substrate 50 (not shown). The epitaxial source/drain regions may be formed by masking the NMOS region and the fins 58 in the PMOS region are etched to form recesses in the fins 58. Then, the epitaxial source/drain regions in the PMOS region are epitaxially grown in the recesses. The epitaxial source/drain regions in the PMOS region may include any acceptable material, such as appropriate for p-type FinFETs. For example, if the fin 58 is silicon, the epitaxial source/drain regions in the PMOS region may include SiGe, SiGeB, Ge, GeSn, or the like. The epitaxial source/drain regions in the PMOS region may also have surfaces raised from respective surfaces of the fins 58 and may have facets, or be merged. In some embodiments, epitaxial source/drain regions are formed in the PMOS region before forming the epitaxial source/drain regions 82 in the NMOS region.

Figure 15B:
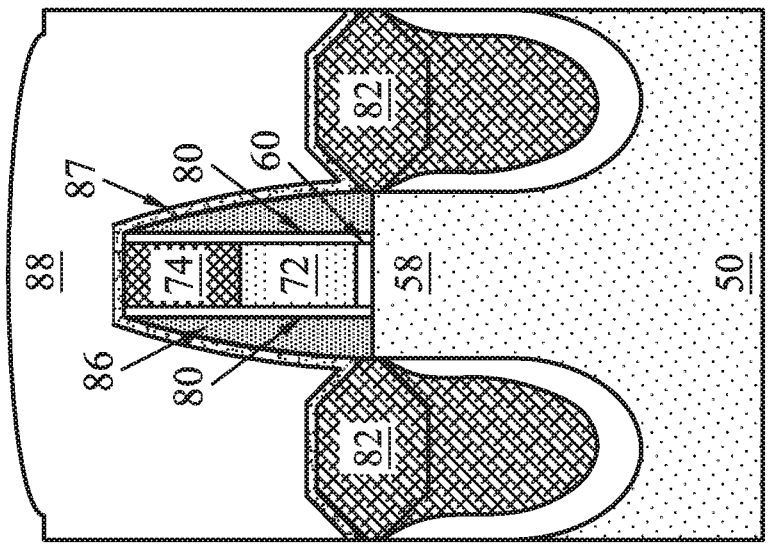
Figure 15A:
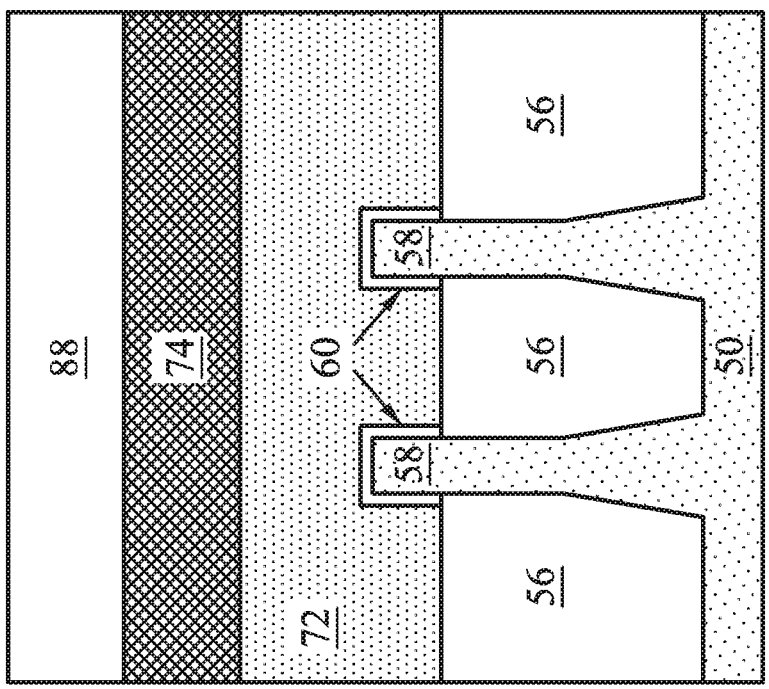

In FIGS. 15A-B, an ILD 88 is deposited over the structure illustrated in FIGS. 12 and 14A-B. The ILD 88 may be formed of a dielectric material or a semiconductor material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous Si, SiGe, Ge, or the like. Other insulation or semiconductor materials formed by any acceptable process may be used. In some embodiments, a contact etch stop layer (CESL) 87 is disposed between the ILD 88 and the epitaxial source/drain regions 82, the hard mask 74, and the gate spacers 86. The CESL 87 may include a dielectric material, such as, SiN, SiO, SiON, the like, or a combination.

Figure 16B:
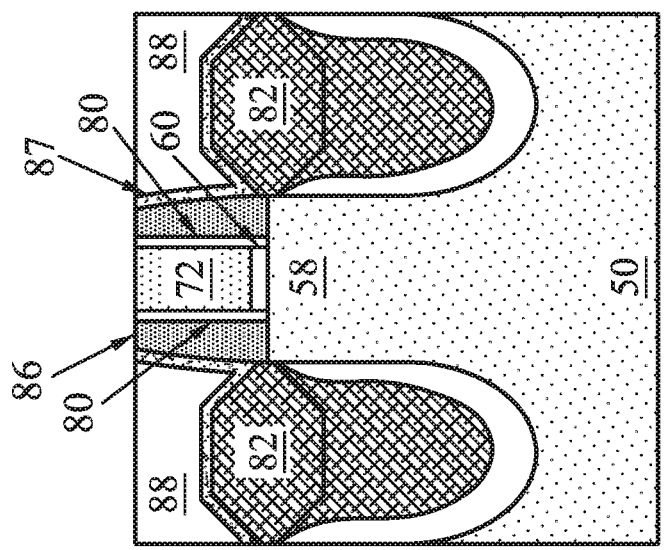
Figure 16A:
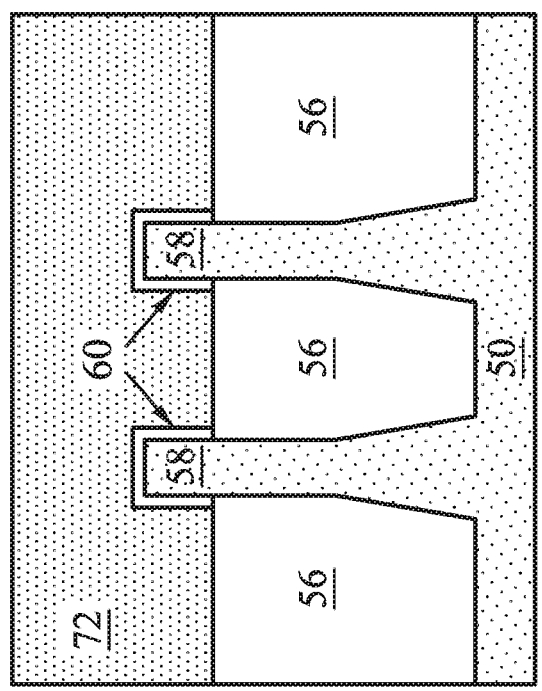

In FIGS. 16A and 16B, a planarization process, such as a CMP, may be performed to level the top surface of the ILD 88 with the top surfaces of the dummy gates 72. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the ILD 88 are level. Accordingly, the top surfaces of the dummy gates 72 are exposed through the ILD 88.

Figure 17B:
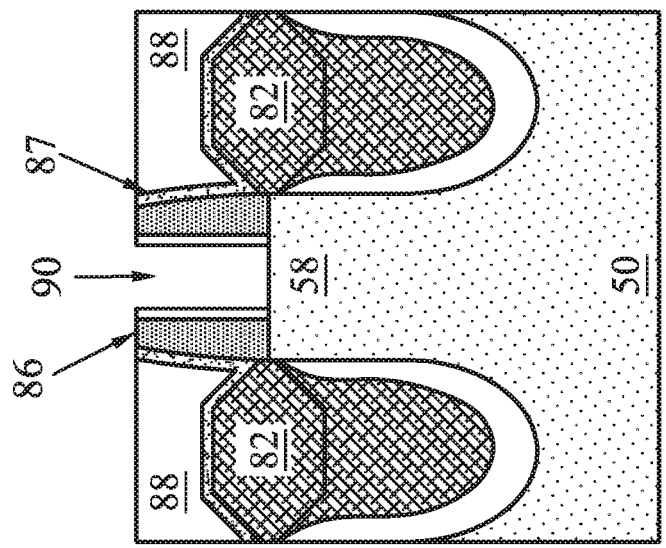
Figure 17A:
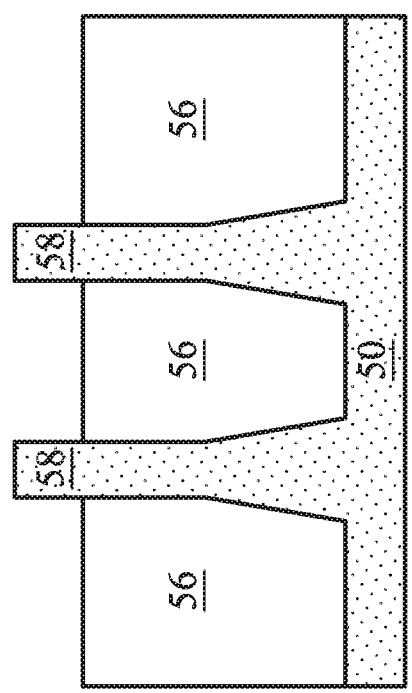

In FIGS. 17A and 17B, the dummy gates 72 and portions of the dummy dielectric layer 60 directly underlying the exposed dummy gates 72 are removed in an etching step(s), so that recesses 90 are formed. In some embodiments, the dummy gates 72 are removed by an anisotropic dry etch process. For example, the etching process may include a dry etch process using reaction gas(es) that selectively etch the dummy gates 72 without etching the ILD 88 or the gate spacers 86. Each recess 90 exposes a channel region of a respective fin 58. Each channel region is disposed between neighboring pairs of the epitaxial source/drain regions 82. During the removal, the dummy dielectric layer 60 may be used as an etch stop layer when the dummy gates 72 are etched. The dummy dielectric layer 60 may then be removed after the removal of the dummy gates 72.

Figure 18B:
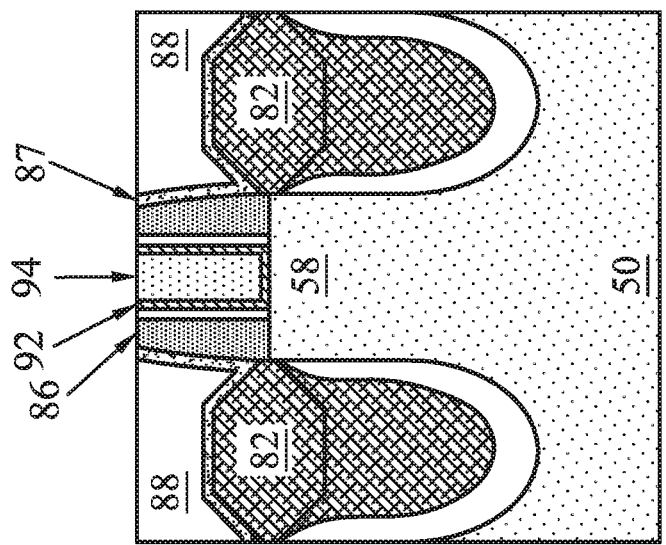
Figure 18A:
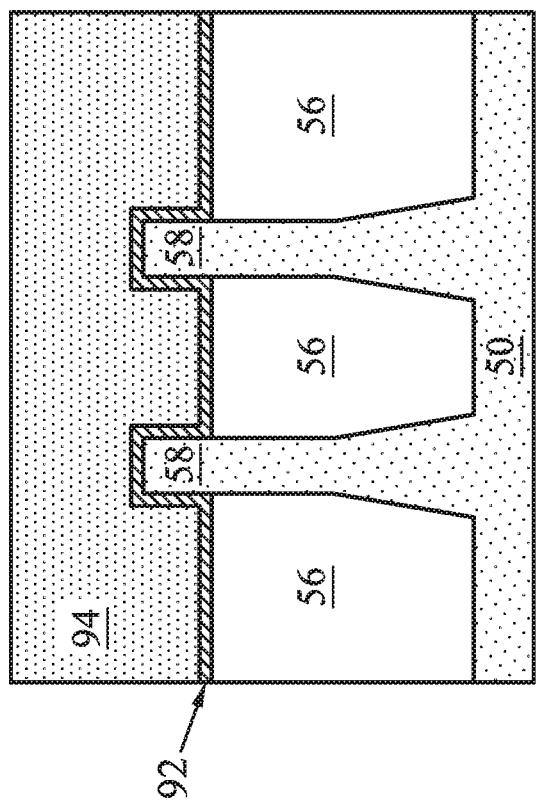

In FIGS. 18A and 18B, gate dielectric layers 92 and gate electrodes 94 are formed for replacement gates. Gate dielectric layers 92 are deposited conformally in the recesses 90, such as on the top surfaces and the sidewalls of the fins 58 and on sidewalls of the gate seal spacers 80/gate spacers 86. The gate dielectric layers 92 may also be formed on top surface of the ILD 88. In accordance with some embodiments, the gate dielectric layers 92 include SiO, SiN, the like, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, the like, or combinations thereof. The formation methods of the gate dielectric layers 92 may include Molecular-Beam Deposition (MBD), ALD, PECVD, or the like.

The gate electrodes 94 are deposited over the gate dielectric layers 92, respectively, and fill the remaining portions of the recesses 90. The gate electrodes 94 may include a metal-containing material such as TiN, TaN, TaC, Co, Ru, Al, combinations thereof, or multi-layers thereof. For example, although a single gate electrode 94 is illustrated, any number of work function tuning layers may be deposited in the recesses 90. After the filling of the gate electrodes 94, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate" or a "gate stack." The gate and the gate stacks may extend along sidewalls of a channel region of the fins 58.

The formation of the gate dielectric layers 92 in NMOS regions and PMOS regions may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and the gate electrodes 94 in each region may be formed by distinct processes, such that the gate electrodes 94 may be different materials. Various masking steps may be used to mask and expose appropriate regions when using distinct processes.

Figure 19A:
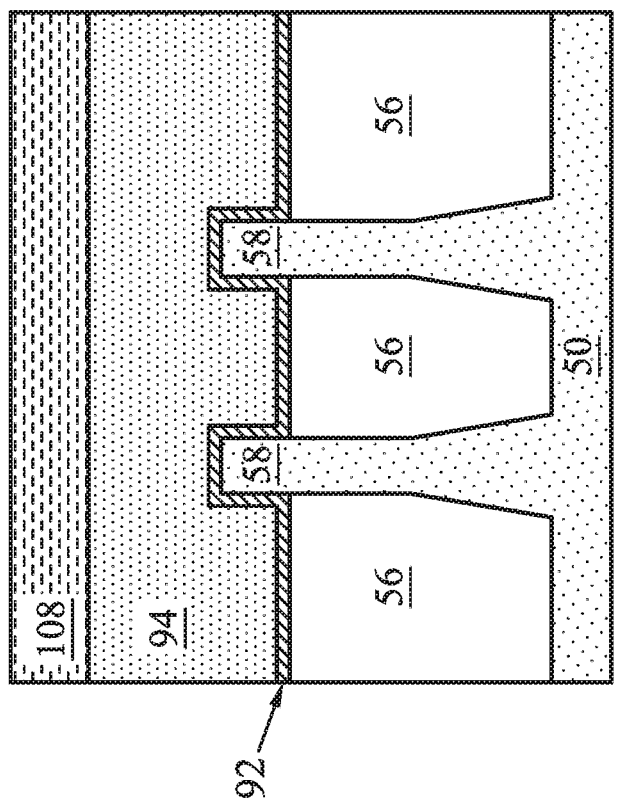
Figure 19B:
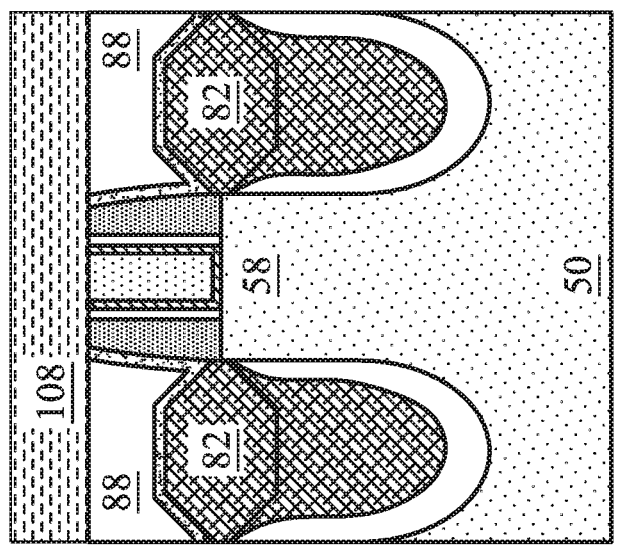

In FIGS. 19A-B, an ILD 108 is deposited over the ILD 88. In an embodiment, the ILD 108 is a flowable film formed by a flowable CVD method. In some embodiments, the ILD 108 is formed of a dielectric material such as PSG, BSG, BPSG, USG, or the like, and may be deposited by any suitable method, such as CVD, PECVD, or the like.

Figure 20B:
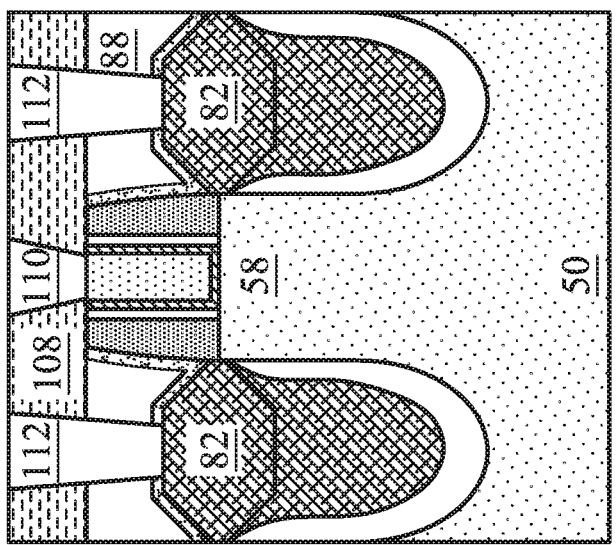
Figure 20A:
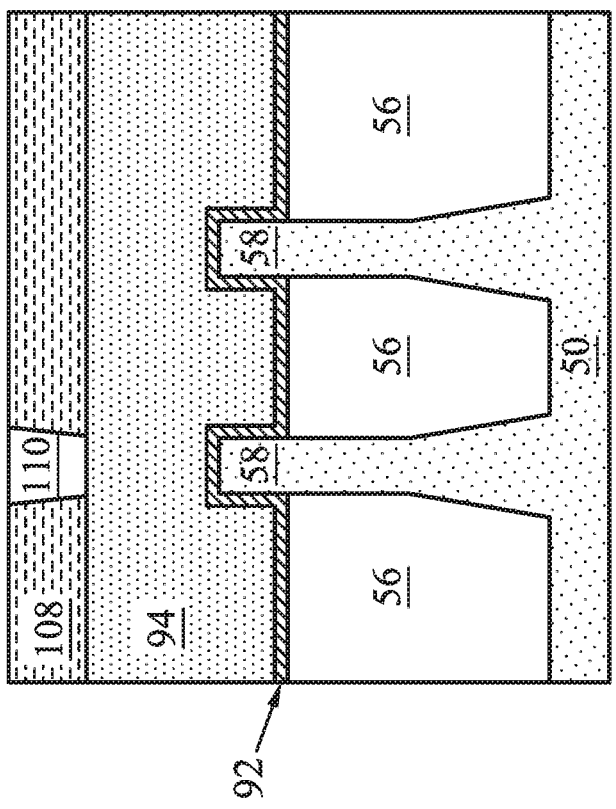

In FIGS. 20A-B, a gate contact 110 and source/drain contacts 112 are formed through the ILD 108 and the ILD 88. Openings for the source/drain contacts 112 are formed through the ILD 108 and the ILD 88, and openings for the gate contacts 110 are formed through the ILD 108. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, the like, or a combination. The conductive material may be copper, a copper alloy, silver, gold, tungsten, cobalt, aluminum, nickel, the like, or a combination. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The contact 110 is physically and electrically connected to the gate electrode 94, and the contacts 112 are physically and electrically connected to the epitaxial source/drain regions 82. FIGS. 20A-B illustrate the contacts 110 and 112 in a same cross-section; however, in other embodiments, the contacts 110 and 112 may be disposed in different cross-sections. Further, the positions of contacts 110 and 112 shown in FIGS. 20A-B are merely illustrative and not intended to be limiting in any way. For example, the contact 110 may be vertically aligned with the fin 58 as illustrated or may be disposed at a different location on the gate electrode 94. Furthermore, the contacts 112 may be formed prior to, simultaneously with, or after forming the contacts 110.

In accordance with an embodiment, a method includes depositing a dummy gate over and along sidewalls of a fin extending upwards from a substrate, forming a gate spacer along a sidewall of the dummy gate, forming a recess in the fin adjacent the gate spacer, and forming a source/drain region in the recess. The forming of the source/drain region includes forming a first layer in the recess, the first layer including silicon doped with a first concentration of germanium and a first concentration of a first n-type dopant, and epitaxially growing a second layer on the first layer, the second layer including silicon doped with a concentration of a second n-type dopant, wherein the second n-type dopant is different than the first n-type dopant, wherein the second layer has a second concentration of germanium that is less than the first concentration of germanium, wherein the second layer has a second concentration of the first n-type dopant that is less than the first concentration of the first n-type dopant, and wherein the first layer separates the second layer from the fin. In an embodiment, the first layer further includes gallium. In an embodiment, the first n-type dopant is arsenic. In an embodiment, the second n-type dopant is phosphorus. In an embodiment, the first layer includes the second n-type dopant, and a first concentration of the second n-type dopant at a top surface of the first layer is greater than a second concentration of the second n-type dopant at a bottom surface of the first layer. In an embodiment, the method further includes epitaxially growing a third layer on the second layer, the third layer having a different material composition than the first layer, the third layer including silicon doped with the second n-type dopant. In an embodiment, the third layer further includes germanium. In an embodiment, a concentration of the second n-type dopant in the third layer is greater than the concentration of the second n-type dopant in the second layer. In an embodiment, forming the first layer in the recess includes implanting the first n-type dopant into sidewalls of the recess.

In accordance with an embodiment, a method includes forming a dummy gate over and along sidewalls of a fin extending upwards from a substrate, forming a gate spacer along a sidewall of the dummy gate, anisotropically etching a recess in the fin adjacent the gate spacer, and epitaxially growing a source/drain region in the recess. Epitaxially growing the source/drain region includes growing a doped silicon layer lining the recess, the first doped silicon layer including a germanium dopant and a first n-type dopant, and growing a second doped silicon layer on the first doped silicon layer, the second doped silicon layer including a second n-type dopant that is different from the first n-type dopant, wherein a portion of the second doped silicon layer is free of the first n-type dopant, and replacing the dummy gate with a functional gate stack disposed over and along sidewalls of the fin. In an embodiment, the first doped silicon layer includes between 0.5% and 2% germanium. In an embodiment, the first n-type dopant is arsenic and the second n-type dopant is phosphorus. In an embodiment, epitaxially growing the source/drain region further includes growing a third doped silicon layer on the second doped silicon layer, the third doped silicon layer including the second n-type dopant. In an embodiment, the third doped silicon layer further includes a germanium dopant. In an embodiment, epitaxially growing the source/drain region further includes growing a fourth doped silicon layer, wherein the fourth doped silicon layer includes a first concentration of the second n-type dopant that is greater than a second concentration of the second n-type dopant in the second doped silicon layer.

In accordance with an embodiment, a device includes a fin extending from a substrate, a gate stack over and along sidewalls of the fin, a gate spacer along a sidewall of the gate stack, and an epitaxial source/drain region in the fin and adjacent the gate spacer. The epitaxial source/drain region includes a first epitaxial layer on the fin, the first epitaxial layer including silicon, germanium, and arsenic, and a second epitaxial layer on the first epitaxial layer, the second epitaxial layer including silicon and phosphorus, the first epitaxial layer separating the second epitaxial layer from the fin. In an embodiment, the epitaxial source/drain region further includes a third epitaxial layer on the second epitaxial layer, the third epitaxial layer including silicon, germanium, and phosphorus. In an embodiment, the epitaxial source/drain region further includes a fourth epitaxial layer on the third epitaxial layer and further includes a fifth epitaxial layer on the fourth epitaxial layer, wherein the fourth epitaxial layer includes silicon and phosphorus, and wherein the fifth epitaxial layer includes silicon and germanium. In an embodiment, the third epitaxial layer, the fourth epitaxial layer, and the fifth epitaxial layer have a concentration of arsenic that is less than that of the first epitaxial layer. In an embodiment, the first epitaxial layer has an atomic concentration of germanium in a range from 0.5% to 2%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a dummy gate over and along sidewalls of a fin extending upwards from a substrate;
   forming a gate spacer along a sidewall of the dummy gate;
   forming a recess in the fin adjacent the gate spacer; and
   forming a source/drain region in the recess, the forming of the source/drain region comprising:
      forming a first layer in the recess, the first layer comprising silicon doped with a first concentration of germanium and a first concentration of a first n-type dopant; and
      epitaxially growing a second layer on the first layer, the second layer comprising silicon doped with a concentration of a second n-type dopant, wherein the second n-type dopant is different than the first n-type dopant, wherein the second layer has a second concentration of germanium that is less than the first concentration of germanium, wherein the second layer has a second concentration of the first n-type dopant that is less than the first concentration of the first n-type dopant, and wherein the first layer separates the second layer from the fin.

2. The method of claim 1, wherein the first layer further comprises gallium.

3. The method of claim 1, wherein the first n-type dopant is arsenic.

4. The method of claim 1, wherein the second n-type dopant is phosphorus.

5. The method of claim 1, wherein the first layer comprises the second n-type dopant, and wherein a first concentration of the second n-type dopant at a top surface of the first layer is greater than a second concentration of the second n-type dopant at a bottom surface of the first layer.

6. The method of claim 1, further comprising epitaxially growing a third layer on the second layer, the third layer having a different material composition than the first layer, the third layer comprising silicon doped with the second n-type dopant.

7. The method of claim 6, wherein the third layer further comprises germanium.

8. The method of claim 6, wherein a concentration of the second n-type dopant in the third layer is greater than the concentration of the second n-type dopant in the second layer.

9. The method of claim 1, wherein forming the first layer in the recess comprises implanting the first n-type dopant into sidewalls of the recess.

10. A method comprising:
    forming a dummy gate over and along sidewalls of a fin extending upwards from a substrate;
    forming a gate spacer along a sidewall of the dummy gate;
    anisotropically etching a recess in the fin adjacent the gate spacer;
    epitaxially growing a source/drain region in the recess, comprising:
       growing a first doped silicon layer lining the recess, the first doped silicon layer comprising a germanium dopant and a first n-type dopant; and
       growing a second doped silicon layer on the first doped silicon layer, the second doped silicon layer comprising a second n-type dopant that is different from the first n-type dopant, wherein a portion of the second doped silicon layer is free of the first n-type dopant; and
    replacing the dummy gate with a functional gate stack disposed over and along sidewalls of the fin.

11. The method of claim 10, wherein the first doped silicon layer comprises between 0.5% and 2% germanium.

12. The method of claim 10, wherein the first n-type dopant is arsenic and the second n-type dopant is phosphorus.

13. The method of claim 10, wherein epitaxially growing the source/drain region further comprises growing a third doped silicon layer on the second doped silicon layer, the third doped silicon layer comprising the second n-type dopant.

14. The method of claim 13, wherein the third doped silicon layer further comprises a germanium dopant.

15. The method of claim 10, wherein epitaxially growing the source/drain region further comprises growing a fourth doped silicon layer, wherein the fourth doped silicon layer comprises a first concentration of the second n-type dopant that is greater than a second concentration of the second n-type dopant in the second doped silicon layer.

16. A device comprising:
    a fin extending from a substrate;
    a gate stack over and along sidewalls of the fin;
    a gate spacer along a sidewall of the gate stack; and
    an epitaxial source/drain region in the fin and adjacent the gate spacer, the epitaxial source/drain region comprising:
       a first epitaxial layer on the fin, the first epitaxial layer comprising silicon, germanium, and arsenic;
       a second epitaxial layer on the first epitaxial layer, the second epitaxial layer comprising silicon and phosphorus, the first epitaxial layer separating the second epitaxial layer from the fin; and
       a third epitaxial layer on the second epitaxial layer, the third epitaxial layer comprising silicon, germanium, and phosphorus.

17. The device of claim 16, wherein the epitaxial source/drain region further comprises a fourth epitaxial layer on the third epitaxial layer and further comprises a fifth epitaxial layer on the fourth epitaxial layer, wherein the fourth epitaxial layer comprises silicon and phosphorus, and wherein the fifth epitaxial layer comprises silicon and germanium.

18. The device of claim 17, wherein the third epitaxial layer, the fourth epitaxial layer, and the fifth epitaxial layer have a concentration of arsenic that is less than that of the first epitaxial layer.

19. The device of claim 16, wherein the first epitaxial layer has an atomic concentration of germanium in a range from 0.5% to 2%.

20. The device of claim 16, wherein the third epitaxial layer has an atomic concentration of germanium that is greater than that of the second layer.

* * * * *